United States Patent [19]

Jin et al.

[11] Patent Number: 4,952,554
[45] Date of Patent: Aug. 28, 1990

[54] APPARATUS AND SYSTEMS COMPRISING A CLAD SUPERCONDUCTIVE OXIDE BODY, AND METHOD FOR PRODUCING SUCH BODY

[75] Inventors: Sungho Jin, Millington; Richard C. Sherwood, New Providence; Robert B. van Dover, Berkeley Heights, all of N.J.

[73] Assignee: AT&T Bell Laboratories, Murray Hill, N.J.

[21] Appl. No.: 36,160

[22] Filed: Apr. 6, 1987

Related U.S. Application Data

[63] Continuation-in-part of Ser. No. 34,117, Apr. 1, 1987, abandoned.

[51] Int. Cl.$^5$ .................. H01L 39/12; H01L 5/08; H01L 39/24
[52] U.S. Cl. ..................... 505/1; 505/204; 505/740; 29/599; 174/125.1; 72/274; 264/61; 264/125; 428/378; 428/379; 428/389; 428/381; 428/471
[58] Field of Search ............ 264/61, 125; 419/8, 419/9, 19, 22; 29/599; 174/125 S, 165.1; 428/36, 313.9, 701, 702, 457, 552, 900, 378, 379, 381, 389, 471; 501/1, 704, 740; 72/274

[56] References Cited

U.S. PATENT DOCUMENTS

| | | | |
|---|---|---|---|
| 3,325,888 | 6/1967 | Weinig et al. | 29/420 |
| 3,409,973 | 11/1968 | Kilp et al. | 419/8 |
| 3,427,222 | 2/1969 | Biancheria et al. | 419/8 |
| 3,429,025 | 2/1969 | Baily et al. | 419/8 |
| 3,471,925 | 10/1969 | Bindari | 29/599 |
| 3,620,799 | 11/1971 | Hoelscher et al. | 419/9 |
| 3,796,553 | 3/1974 | Daunt | 174/126 S |
| 4,050,147 | 9/1977 | Winter | 29/599 |
| 4,109,374 | 5/1978 | Whitstone et al. | 29/599 |
| 4,112,197 | 9/1978 | Metz | 428/658 |
| 4,127,700 | 11/1978 | Stockel et al. | 75/232 |
| 4,141,727 | 2/1979 | Shida et al. | 75/232 |
| 4,336,065 | 6/1982 | Bergmann et al. | 419/24 |
| 4,386,970 | 6/1983 | Fukutsuka et al. | 148/11.5 P |
| 4,505,762 | 3/1985 | Fukutsuka et al. | 148/11.5 P |
| 4,629,515 | 12/1986 | Imaizumi et al. | 148/11.5 P |
| 4,704,249 | 11/1987 | Glatzle | 419/4 |
| 4,826,808 | 5/1989 | Yurek et al. | 505/1 |

OTHER PUBLICATIONS

Physical Review Letter, 3/2/87, pp. 908-910, Wu et al.; "Superconductivity at 93K in a New Mixed-Phase Y-Ba-Cu-O Compound System at Ambient Pressure". Zeitscher F. Physik B-Condensed Matter, vol. 64 (1986) "Possible High $T_C$ Superconductivity in the BA-La-Cu-O System", by J. G. Bednorz et al. pp. 189-193.

(List continued on next page.)

Primary Examiner—Stephen J. Lechert, Jr.
Attorney, Agent, or Firm—Eugen E. Pacher

[57] ABSTRACT

A method of producing normal-metal-clad superconductive oxide wire, tape and the like is disclosed. The method comprises forming an intermediate body by surrounding a quantity of the oxide powder (e.g., $Ba_2YCu_3O_{6.9}$) with an appropriate normal metal jacket, reducing the cross section of the intermediate body by any appropriate technique (e.g., drawing or rolling), and heat treating the elongated body such that substantial sintering of the powder results, and such that, after completion of the heat treatment, the sintered oxide has a composition that is associated with superconductivity in unclad bulk samples of the oxide. The latter condition requires that at least the portion of the cladding that is in contact with the oxide powder is substantially inert with respect to oxygen and the oxide under the conditions of the heat treatment. Silver is the currently preferred inert normal metal. Exemplarily, Ag can be used to provide a diffusion barrier with other normal metal (e.g., Ni and Cu) surrounding the diffusion barrier, or the cladding can consist substantially of Ag. Various techniques for preventing oxygen loss and/or restoring lost oxygen from the powder are disclosed. Advantageously the elongated body is appropriately shaped (e.g., wound into a helical coil) prior to the heat treatment. Elongate bodies produced according to the invention can advantageously be used as superconductive magnets, and in a variety of other apparatus and systems.

23 Claims, 3 Drawing Sheets

OTHER PUBLICATIONS

*Physica* 126B (1964) "Superconductivity in Ba(PbBi)$O_3$", by B. Batlogg, pp. 275–279.

*Superconductor Materials Science, Metallurgy, Fabrication and Applications,* editors S. Foner et al., Plenum Press, New York (Title Page).

*Superconductor Applications: Squids and Machines,* Editors B. B. Schwartz et al., Plenum Press, New York, p. 674 and title page.

*Physical Review Letters,* vol. 58, No. 9, 2 Mar. 1987, "High-Pressure Study of the New York–Ba–Cu–O Superconducting Compound System", by P. H. Hor et al., pp. 911–912.

*New York Times,* Saturday, Mar. 28, 1987, p. 6 "New Gain on Conducting Electricity".

"Observation of the Inverse Ac Josephson Effect at 240K", by J. T. Chen et al., (9 pages)—to be published

APPARATUS AND SYSTEMS COMPRISING A CLAD SUPERCONDUCTIVE OXIDE BODY, AND METHOD FOR PRODUCING SUCH BODY

This application is a continuation in part of application Ser. No. 07/034,117 filed Apr. 1, 1987, now abandoned.

FIELD OF THE INVENTION

This invention pertains to methods for producing clad superconductive wire-like and ribbon-like bodies and to apparatus and systems that comprise such bodies.

BACKGROUND OF THE INVENTION

From the discovery of superconductivity in 1911 to the recent past, essentially all known superconducting materials were elemental metals (e.g., Hg, the first known superconductor) or metal alloys (e.g., $Nb_3Ge$, probably the material with the highest transition temperature $T_c$ known prior to 1986).

Recently, superconductivity was discovered in a new class of materials. See, for instance, B. Batlogg, *Physica*, Vol. 126, 275 (1984), which reviews the properties of superconductivity in barium bismuth lead oxide, and J. G. Bednorz and K. A. Muller, *Zeitschr. f. Physik B-Condensed Matter*, Vol. 64, 189 (1986), which reports superconductivity in lanthanum barium copper oxide.

Especially the latter report stimulated worldwide research activity, which very quickly resulted in further significant progress. The progress has resulted, inter alia, to date in the discovery the compositions in the Y-Ba-Cu-O system can have superconductive transition temperatures $T_c$ above 77 K., the boiling temperature of liquid $N_2$ (M. K. Wu et al, *Phys. Rev. Letters*, Vol. 58, Mar. 2, 1987, page 908; and P. H. Hor, ibid, page 911). Furthermore, it has resulted in the identification of the material phase that is responsible for the observed high temperature superconductivity, and in the discovery of compositions and processing techniques that result in the formation of bulk samples of material that can be substantially single phase material and can have $T_c$ above 90 K. (see the U.S. patent application Ser. No. 024,046, entitled "Devices and Systems Based on Novel Superconducting Material," filed by B. J. Batlogg, R. J. Cava and R. B. van Dover on Mar. 10, 1987, co-assigned with this and incorporated herein by reference, which is a continuation-in-part of an application filed by the same applicants on Mar. 3, 1987, which in turn is a continuation-in-part of application Ser. No. 001,682, filed by the same applicants on Jan. 9, 1987).

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be the most convenient cryogenic refrigerant. Attainment of superconductivity at liquic nitrogen temperature was thus a long-sought goal which for a long time appeared almost unreachable.

Although this goal has now been attained, there still exists at least one barrier that has to be overcome before the new oxidic high $T_c$ superconductive materials can be utilized in many technological applications. In particular, techniques for forming superconductive bodies of technologically significant shape have to be developed.

The superconductive oxide material is readily produced in powder form, and has been processed by ceramic techniques into various shapes such as pellets, discs, and tori. A recently filed U.S. patent application Ser. No. 025,913, entitled "Apparatus Comprising a Cermaic Superconductive Body, and Method for Producing Such a Body", filed Mar. 16, 1987 by E. M. Gyorgy and D. W. Johnson, Jr., incorporated herein by reference, discloses techniques for making ceramic superconductive bodies having at least one relatively small dimension (5 $\mu$m–1 mm). Such filamentary and sheet-like bodies include thin rods, filaments, tapes, and sheets, which can be incorporated into a variety of apparatus such as Bitter magnets, transmission lines, rotating machinery, maglev vehicles, and fusion devices.

Perhaps the economically most significant application of prior art metallic superconductors (e.g., $Nb_3Sn$) is in the form of magnet wires. Magnets incorporating such wires can be found in many scientific laboratories and, inter alia, are to be used in the proposed giant particle accelerator, the so-called "Superconducting Supercollider". Prior art superconductive wires universally have a composite structure, with one or more superconductive filaments embedded in normal metal, typically copper. The normal (i.e., nonsuperconductive.) metal, typically copper. The normal metal serves several critical functions in such wires, among them provision of a by-pass electrical conduction path, provision of thermal cnductive means in the event of local flux motion, and enhancement of the mechanical strength of the wire.

For an overview of some potential applications of superconductors see, for instance, B. B. Schwartz and S. Foner, editors, *Superconductor Applications: SQUIDS and Machines*, Plenum Press 1977; S. Foner and B. B. Schwartz, editors, *Superconductor Material Science, Metallurgy, Fabrications, and Applications*, Plenum Press 1981. Among the applications are power transmission lines, rotating machinery, and superconductive magnets for e.g., fusion generators, MHD generators, particle accelerators, levitated vehicles, magnetic separation, and energy storage. The prior art has considered these actual and potential applications in terms of the prior art (non-oxidic) superconductors. It is expected that many of the above and other applications of superconductivity would materially benefit it high $T_c$ superconductive wire could be used instead of the previously considered relatively low $T_c$ wire. We are disclosing herein techniques for producing such wire, as well as other bodies such as tape.

SUMMARY OF THE INVENTION

Disclosed is a method for producing elongate superconductive bodies in which the superconductive material is sintered oxide, typically a cuprate, and is surrounded by a cladding, typically a normal metal. Cuprates of interest herein typically are of nominal composition $M_{3-m}M'_mCu_3O_{9-\delta}$, with M being preferably primarily Ba (substitution of all or some Ba by elements such a Ca and Sr is contemplated), M' being preferably one or more of Y, La, Eu, Lu, and Sc, m being preferably about 1, $\delta$ being typically in the range 1.5–2.5, and the divergence from the nominal formula amounts of M and M' being typically at most 10%. Currently preferred cuprates have nominal composition $Ba_2YCu_3O_9$.

$\delta$ where $\delta$ is in the approximate range 1.5–2.5, preferably about 2.1.

Such bodies are frequently referred to herein as "wires" or "tapes", respectively. This usage is not intended to imply any limitation, e.g., with regard to cross section of the wire-like bodies (for instance, such bodies may advantageously have noncircular cross section and may also have a multiplicity of coaxial superconductive bodies).

The inventive method comprises forming an intermediate body, forming the elongate wire-like or tape-like body from the intermediate body by means of one or more cross section-reducing operations (e.g., one or more passes through wire drawing dies, or through rolling apparatus), and heat treating the elongate body.

Frequently the elongate body will be subjected to a shaping operation prior to the heat treatment, such that the elongate body is put into a form that substantially corresponds to the shape in which the body is to be used. For instance, the body may be wound helically on a mandrel into the shape of a magnet coil.

The intermediate body typically comprises a quantity of oxide powder surrounded by a diffusion barrier which in turn is surrounded by a normal metal jacket. Exemplarily, the normal metal jacket is a copper tube, the diffusion barrier comprises a thin-walled silver tube inside a thin-walled Ni tube, and the oxide powder is packed into the silver tube. If the normal metal jacket material is inert with respect to the oxide then a diffusion barrier may not be required. Ag is such an inert metal, at least with regard to (Ba, Y) cuprate.

The heat treatment of the elongate body is carried out such that substantial sintering of the oxide powder occurs, and such that, after completion of the heat treatment, the chemical composition of the sintered powder is within predetermined limits that are associated with the occurrence of superconductivity in the sintered oxide powder. The oxides of concern herein are relatively unstable with regard to their oxygen content (e.g., they can readily lose oxygen when heated to some relatively high temperature) and are superconductive only within a relatively narrow range of oxygen content. Therefore, the invention requires that measures be taken to insure that, upon completion of the heat treatment, the oxygen content of the sintered material is such that the material becomes superconductive at a technologically significant temperature, typically $>77$ K. Among such measures are hermetic sealing of the intermediate body at ambient or higher oxygen partial pressure, optionally together with placement of oxygen donor material (e,g., $BaO_2$ or $AgO$) inside the diffusion barrier, or introduction of oxygen into the space inside the diffusion barrier directly through the powder material, or possibly through a perforated tube placed axially inside the barrier or through perforations in the normal metal cladding.

The inventive method can be used to, inter alia, produce monofilament or multifilament superconductive wire of a variety of cross sectional shapes, or to produce tape or ribbon containing one or more superconductive elements. Many systems as well as apparatus can advantageously comprise wire or tape according to the invention. The availability of these superconductive bodies typically will make possible operation at a higher temperature than would be possible with prior art superconductive wire. Exemplary of apparatus that advantageously comprises inventive wire or tape is a superconductive solenoid, and exemplary of such systems is a particle accelerator, a maglev transportation system, a fusion reactor with magnetic confinement, and a power transmission line. Inventive bodies may also be used as signal transmission lines in electronic apparatus. Preferred embodiments become superconductive at a temperature $T_c > 77$ K. An example of a material with $T_c > 77$ K. is $Ba_2YCu_3O_{6.9}$. There have recently been reported claims that indications of superconductivity have been observed above 200 K., at temperatures as high as 240 K., in some oxies (cuprates) of the type that is of concern herein. See, for instance, *New York Times*, Saturday Mar. 28, 1987, page 6, which reports on observations made at Wayne State University. See also J. T. Chen et al, "Observation of the Inverse ac Josephson Effect at 240K", to be published. Similar claims have also been made by workers at Berkeley University. The inventive method for making elongate oxide superconductive bodies comprising a normal metal cladding is broadly applicable to forming such bodies from oxide powder and is, in particular, applicable to forming such bodies from cuprate powders such as the (La, Y) cuprate on which the Wayne State and Berkeley experiments were done. We will refer to cuprate superconductive bodies that comprise cuprate powder having substantially the composition used by these workers as being of the "Wayne State University" type.

DETAILED DESCRIPTION OF SOME PREFERRED EMBODIMENTS

For reasons similar to those given above for prior art superconductive wires, wires and tapes based on superconductive oxide also advantageously are composite bodies that comprise normal metal cladding that surrounds the superconductive oxide body or bodies. A reason for embedding the superconductive oxide body in a normal metal that is not present in prior art wires is the need to substantially eliminate interaction of the superconductive material with the environment. We have found, for instance, that the oxygen content of some cuprate powders in air can decrease with time even at room temperature. Such decrease can impair the superconductive properties of the material. Furthermore, the possibility of adverse reaction with water vapor, $CO_2$, and other environmental gases exists. A still further reason is the need for mechanical support of the generally relatively brittle sintered oxide body such that the body can withstand the Lorentz forces due to the interaction of the current through the body and the magnetic field created by the current.

Figure 1:
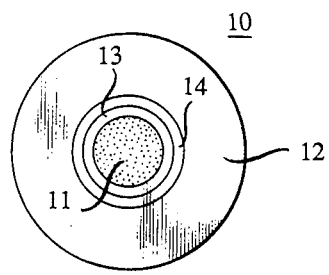
FIGS. 1 and 2 show schematically in end view exemplary monofilament and multifilament inventive wire, respectively.

FIG. 1 schematically depicts the end view of an exemplary wire (10) according to the invention, in which 11 is the sintered oxide superconductive filament, 12 is the normal metal (e.g., Cu) jacket, 13 and 14 are the two layers of a diffusion barrier, where 13 is a material (e.g., Ag, Au, Pd) that is relatively inert with respect to oxygen and the other constituents of the oxide, and 14 is a material that substantially does not form an alloy with the material of 12 as well as with the material of 13. If 12 is Cu and 13 is Ag, then 14 can advantageously be Ni.

Figure 2:
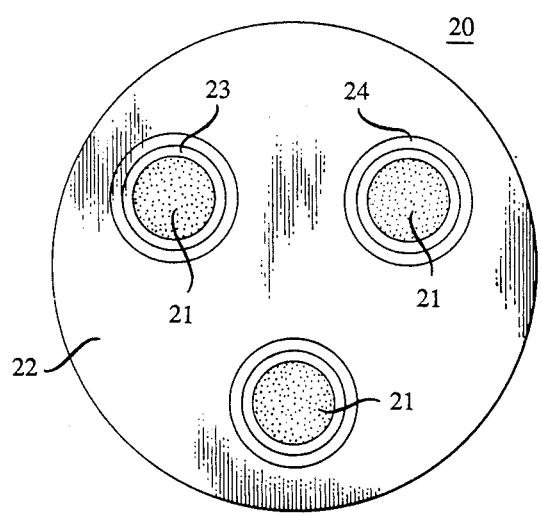

FIG. 2 similarly depicts schematically the end view of an exemplary multifilament wire (20), in which each of three sintered oxide filaments 21 is surrounded by a diffusion barrier 23, and is embedded in normal metal 22. A further exemplary embodiment (not shown) comprises a superconductive oxide filament surrounded by a dielectric layer which in turn is surrounded by a tubular superconductive oxide body, (possibly with diffusion barriers where needed) with this coaxial assembly being surrounded by normal metal cladding.

Figure 3:
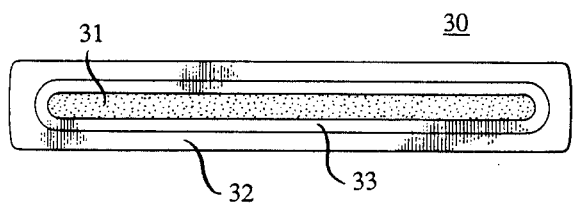
FIG. 3 similarly depicts an exemplary iventive tape.
Figure 4:
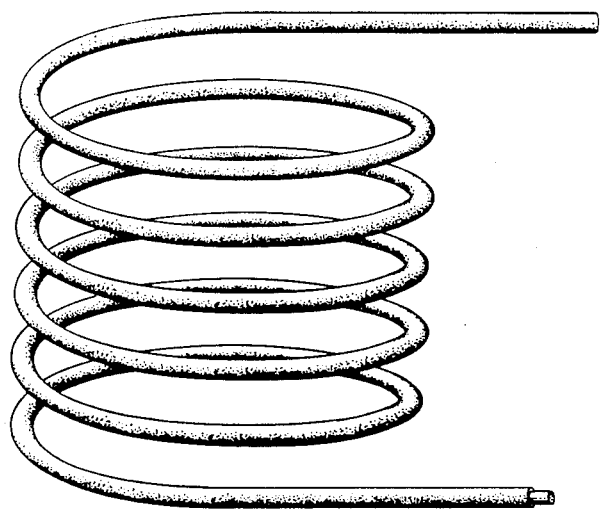
FIG. 4 schematically shows wire according to the invention shaped into a helical coil.
Figure 5:
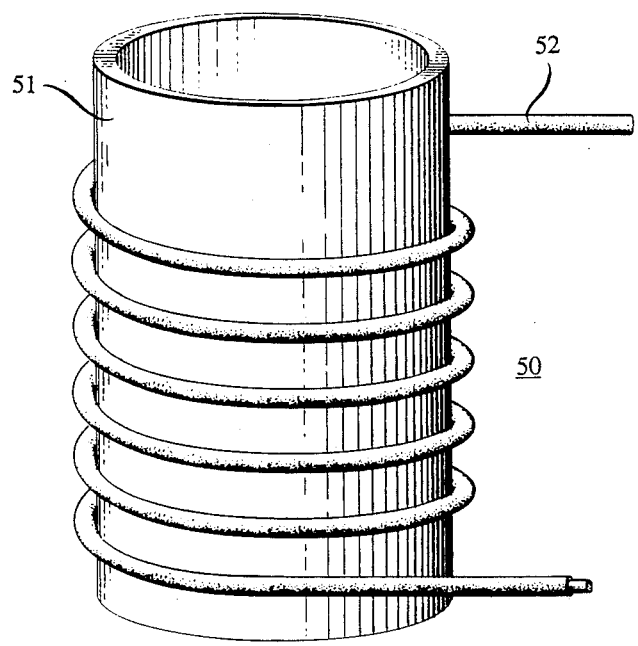
FIG. 5 schematically depicts a superconductive magnet.

FIG. 3 schematically depicts an inventive tape 30, with 31 being the sintered oxide body, 33 the diffusion barrier, and 32 the normal metal jacket. Another exemplary inventive tape (not shown) contains a multiplicity of ribbon-like superconductive bodies embedded in a normal metal cladding.

A significant aspect of the invention is processing that results in a normal metal-clad oxide superconductive body or bodies (filament(s), ribbon(s)) having technologically significant superconductive properties. Among the most important of these properties is the transition temperature $T_c$ (herein considered to be the highest temperature at which the DC resistance is zero to within measurement limits). Desirably $T_c > 77$ K. Furthermore, the transition temperature of the composite clad body is desirably close to (preferably no less than 90% of) the transition temperature of a bulk ceramic body of essentially the same composition.

The processing is a multistep procedure that typically comprises some or all of the steps below. The oxide starting material can be produced by a known process that exemplarily comprises mixing metallic oxides, hydroxides, carbonates, hydrates, oxalates or other reactive precursors with a lubricating liquid in the appropriate ratio to obtain the desired final composition, filtering and drying the slurry, fragmenting the dried cake, and calcining the fragments in an $O_2$-containing atmosphere (exemplarily heating to 900° C., 2 hours at temperature, furnace cool). The calcined fragments are again milled, re-fragmented and fired, as needed to achieve homogeneity. The homogeneous material is then fragmented to produce a powder of the desired mesh size.

The thus produced powder optionally is heat treated (typically 300°–700° C., 10 minutes–2 hours, $O_2$ partial pressure 0.1–10 at, and/or is optionally mixed with oxygen donor powder (e.g., finely divided silver oxide such as AgO) or grain growth inhibitor (Ag powder). The powder is then packed into a container that comprises the normal metal (e.g., Cu, Ag, maraging steel) outer jacket and, optionally, one or more diffusion barriers (e.g., Ni and Ag). The outer jacket surface may be protected against oxidation by means of a layer of appropriate material (e.g., Ag). The container is then closed (e.g., pinched off or welded), or loss of oxide powder prevented by other appropriate means, and subjected to some appropriate cross section-reducing step(s) such as drawing through a series of dies, or rolling, swaging or extruding, either at room temperature or at some other (typically elevated) temperature. The thus produced elongate composite body is then optionally subjected to a shaping operation (e.g., wound on a mandrel into a coil shape).

The (shaped or unshaped) elongate body is then heat treated to result in substantial sintering of the oxide powder. The currently preferred heat treatment typically comprises heating the body to a temperature in the range 700°–950° C., maintaining it at that temperature until substantial sintering has taken place (exemplarily 0.1–100 hours), relatively slow cooling to a temperature in the range 300°–700° C., and maintaining it at that temperature until the desired oxygen concentration is established in the sintered material (exemplarily 1–24 hours).

If the composite body comprises precipitation-hardenable normal metal (e.g., maraging steel) then the above heat treatment advantageously is followed by a known precipitation hardening treatment.

The need to embed the oxide body in normal metal, together with the tendency of the relevant oxides to lose oxygen a relatively high temperatures (and to take up oxygen at somewhat lower temperatures) requires novel processing features. Among these features typically is the need to prevent contact of the powder with material that can oxidize at temperatures encountered during processing. The currently preferred technique for preventing such contact is to surround the oxide with a thin layer of an appropriate non-reactive material, e.g., Ag or Au. Various materials such as Pd, Ru, Rh, Ir, Os, Pt, Ni, and stainless steel may also be useful under some circumstances. We refer to this layer as the diffusion barrier.

Under some circumstances, inventive wire (or tape) need not comprise a diffusion barrier. For instance, if the normal metal jacket consists of metal that is substantially inert with respect to oxygen and does not "poison" the oxide then no diffusion barrier is required. We have discovered that, at least for (Ba, Y) cuprate, Ag is such a normal metal.

Novel processing features are also occasioned by the need to maintain the oxygen content of the sintered powder within a relatively narrow range. Sintering of the oxide particles is frequently carried out at temperatures above about 700° C. We have observed that at such temperatures under ordinary pressure the oxides of interest herein frequently lose oxygen. Thus, the inventive method typically comprises features designed to prevent the loss of the freed oxygen from the powder-containing space. Exemplarily this is accomppplished by hermetic sealing of the elongate body prior to the heat treatment, possibly in a high $O_2$-pressure environment, by connecting a high pressure $O_2$ reservoir to the ends of the elongate body during heat treatment, or by carrying out the heat treatment in relatively high pressure (e.g., 2–20 atm) oxygen. In the latter case oxidation of the normal metal surface has to be prevented. Thus, either the normal metal jacket consists of relatively inert material (e.g., Ag) or the surface of the jacket is coated with a relatively inert material (e.g., Ag, Au, or Pd).

Instead of, or in addition to measures designed to prevent loss of $O_2$ from the space occupied by the oxide power, the inventive method may also comprise measures designed to introduce $O_2$ into that space. Exemplarily this can be done by forcing a flow of $O_2$ through the space, or, preferably, by introducing an oxygen donor material (e.g., $BaO_2$ or AgO powder) into the space. Such donor material releases oxygen during heat treatment, with the released oxygen then being available for incorporation into the superconductive oxide.

It will be appreciated by those skilled in the art that a material, in order to be useful as an oxygen donor must not be a poison of the superconductive oxide, i.e., react with the oxide in a manner that substantially impairs its superconductive properties.

In some cases it may be possible to place a perforated tube into the powder space of the intermediate body, such that, after carrying out the size-reducing operation, a perforated channel exists through the powder. Through this channel $O_2$ can then easily be supplied. In some cases, it may be advantageous to perforate, at appropriate intervals, the normal metal that surrounds the oxide powder, and to contact the perforated elongate body with oxygen during the heat treatment.

As indicated above, the superconductive oxides frequently give up oxygen heated heated to a relatively high temperature (e.g., about 900° C.) in ambient air or in moderate (e.g., 1 atmosphere) $O_2$ pressure. On the other hand, these oxides frequently take up oxygen upon cooling to intermediate temperatures. This thermodynamic property of the oxide may form the basis of a novel heat treatment in which the oxygen partial pressure over the oxide powder is adjusted such as to maintain optimum oxygen stoichiometry during the heat treatment. Although the details of the treatment depend frequently on the composition of the powder as well as the temperature, it can be said that in the novel variable $O_2$-pressure heat treatment the (relatively high temperature) sintering step typically is carried out at a relatively high (e.g., 1.5-20 atm) $O_2$ partial pressure, and the subsequent (relatively low temperature) step is carried out at a relatively low (e.g., 1-5 atm) $O_2$ partial pressure, with a slow cool from the high to the low temperature being currently preferred.

As will be appreciated by those skilled in the art, the temperature at which a particular heat treatment step is carried out depends inter alia on the length of the treatment step. Thus, the sintering can be carried out at a relatively low temperature (e.g., 700° C.) if the sintering time is relatively long (e.g., >24 hours). Typically the sintering temperature is in the range 600°-1100° C., and the time from 0.1 to 1000 hours. The length and temperature of the sintering step typically also depend on the size of the oxide particles, with smaller particles making possible shorter time and/or lower temperature, due to the increased thermodynamic driving force for the sintering process. It is thus currently considered advantageous to use relative small particle size powders (e.g., <5 μm, preferably <2 μm, more preferably <0.5 μm, average diameter) in the practice of the invention.

The oxide powders used in the practice of the invention advantageously have stoichiometric composition. By this we mean herein that they have a composition that is associated with high temperature superconductivity in bulk ceramic bodies produced from such powders. We have discovered that in at least some cases the partitioning (e.g., ball milling) process that is used to produce particles of the desired mesh size may, in addition to straining the material, result in a change in composition. For this reason, it may in some circumstances be desirable to subject the properly sized powder to a relatively low temperature (e.g., 300°-700° C.) oxygen anneal (exemplarily 0.1-10 atm of $O_2$) for about 10 minutes-2 hours prior to compacting the powder into the intermediate body.

As indicated above, in many cases it is desirable to shape the elongate clad body that is produced from the intermediate body by some appropriate known cross section-reducing process prior to heat treating the elongate body. The heat treatment typically results in sintering of the oxide powder and therefore typically reduces the formability of the superconductive element. On the other hand, the heat treatment frequently results in softening of the normal metal component(s) of the elongate body. In order to produce inventive bodies having both formability prior to sintering and good mechanical strength, it is frequently desirable to use precipitation hardenable normal metal as cladding material. As is well known, such alloys (e.g., maraging steel, or Cu-Ni-Sn spinodal alloy) can be hardened by means of a relatively low temperature treatment after wire drawing and shaping. Such treatment typically does not affect the superconductive properties of the sintered oxide element(s). If applied to a properly shaped superconductive wire or tape (e.g., a helical coil) it can result in an article that can be readily handled and further processed.

EXAMPLE I

Powder (approximately 2.5 μm average particle size) of nominal composition $Ba_2YCu_3O_{6.9}$ was produced by a known process and subjected to a 600° C., 15 minutes anneal in 1 atm of $O_2$. A bulk body produced from the thus prepared powder has $T_c(R=0)$ of about 93 K. A silver tube (0.250 inches outside diameter, 0.030 inches wall thickness, was filled with the powder and the ends of the tube sealed. The thus produced preform was drawn down to 0.060 inches diameter in 15 passes at room temperature. The resulting wire was wound into a coil on a 1.5 inch diameter mandrel. At this stage the coil does not exhibit superconductivity. The coil was then heat treated as follows: heated to 900° C., maintained at 900° C. for 8 hours; furnace cooled to 600° C., maintained at 600° C. for 4 hours; furnace cooled to about 350° C. All of this treatment was carried out in about 1 atm of flowing $O_2$. The coil was then removed from the furnace, and a portion tested by standard DC-resistance measurement. The results of this measurement are given in FIG. 6. As can be seen, the wire was fully superconducting at 91 K. The sintered oxide was removed from a portion of the coil, powdered, and analyzed by a standard powder X-ray technique. The spectrum of the material was essentially the same as that of a sintered bulk sample of composition $Ba_2YCu_3O_{6.9}$.

EXAMPLE II

A coil is prepared substantially as described in Example I, except that a 3/16 inch OD, ⅛ inch ID copper tube is used. A diffusion barrier was formed by first wrapping 0.002 inch thick Ni foil into the tube, followed by similarly wrapping 0.002 inch thick Au foil into the tube. The thus formed normal metal jacket is then filled with powder. A portion of the wire is measured. The superconductive properties are substantially the same as those of the wire of Example I.

EXAMPLE III

A coil was produced substantially as described in Example I, except that a 3/16 inch OD, ⅛ inch ID copper tube was used instead of the silver tube. No superconductivity above 77 K. was observed in the coil.

EXAMPLE IV

A coil was prepared substantially as described in Example I. After winding of the coil but prior to heat treating the coil, the Ag clad is perforated at intervals of about 1 inch. The heat treated coil was superconductive, with $T_c(R=0)$ about 91 K.

EXAMPLE V

A coil was prepared substantially as described in Example II, except that 0.002 inch Pt foil was used instead of the Au foil. A portion of the wire was measured and showed a broad transition to a low resistance state, terminating at about 30 K.

EXAMPLE VI

A tape is prepared substantially as described in Example I, except that the sealed, powder-filled Ag tube is elongated by rolling to 0.010 inch thickness in a standard rolling mill.

EXAMPLE VII

Figure 6:
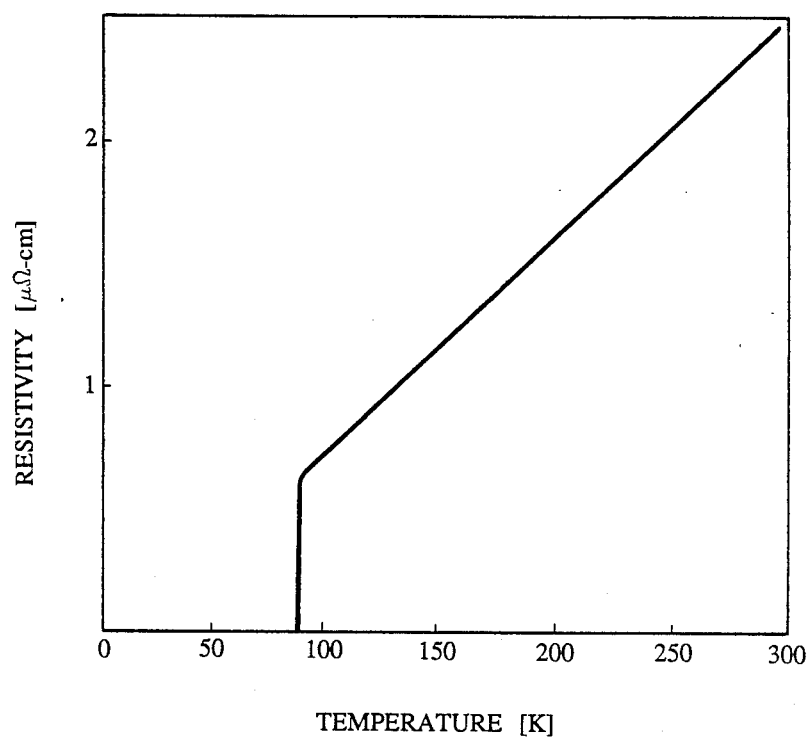
FIG. 6 shows the resistance as a function of temperature of a clad superconductive oxide body according to the invention.

A coil is prepared substantially as described in Example I except that AgO powder (about 1.3 μm average particle size) is mixed with the cuprate powder (20% b.w. AgO). The coil has a superconductive transition substantially as shown in FIG. 6.

What is claimed is:

1. Method of producing an elongate superconductive body,
   characterized in that the method comprises
   (a) forming an intermediate body comprising a normal metal cladding surrounding a quantity of oxide powder and in contact therewith;
   (b) forming an elongate body from the intermediate body by means of one or more cross-section-reducing operations; and
   (c) heat treating the elongate body such that substantial sintering of the oxide powder occurs, with the oxide powder being in contact with an oxygen-containing atmosphere during at least a part of step (c), with the oxygen concentration in the atmosphere such that the thus produced body manifests superconductivity, with $T_c$ of 77 K. or above, wherein at least the portion of the cladding that is in contact with the oxide powder consists essentially of normal metal that is substantially inert with respect to oxygen and with respect to the oxide powder under the heat treating conditions.

2. Method of claim 1, wherein the oxide powder is a cuprate powder of nominal composition $Ba_2YCu_3O_{9-\delta}$ ($1.5 < \delta < 2.5$).

3. Method of claim 1, wherein the normal metal cladding comprises a diffusion barrier, with at least the portion of the diffusion barrier that is in contact with the oxide powder consisting essentially of normal metal that is substantially inert with respect to oxygen and with respect to the oxide powder under the heat treating conditions.

4. Method of claim 3, wherein the portion of the diffusion barrier consists substantially of material selected from the group consisting of Ag and Au.

5. Method of claim 1, wherein the cross-section-reducing operation comprises wire drawing, swaging, extrusion, or rolling.

6. Method of claim 2 wherein (c) comprises
   (i) maintaining the elongate body at a temperature in the range from about 700° to about 950° C. for a time in the range from about 0.1 to about 1000 hours; and
   (ii) wherein (c) is carried out such that, upon completion of (c), the oxygen content of at least a portion of the sintered cuprate powder corresponds to $\delta \sim 2.1$.

7. Method of claim 6, wherein the elongate body comprises oxygen donor material adapted for providing the effective oxygen concentration.

8. Method of claim 6, wherein the elongate body, the normal metal cladding has at least one orifice that permits access to the powder, the wherein (ii) comprises providing oxygen to the powder through the orifice.

9. Method of claim 1, wherein the superconductive body is a monofilament or multifilament wire, or a monofilament or multifilament tape, or a coaxial wire.

10. Method of claim 1, further comprising a shaping operation carried out on the elongate body prior to (c).

11. Method of claim 10, wherein the shaping operation comprises forming a helical coil.

12. Method of claim 1, wherein the normal metal cladding comprises a precipitation-hardenable normal metal, and wherein the method comprises a precipitation hardening step.

13. Method of claim 8, wherein oxygen is provided to the powder under a pressure above 1 atmosphere.

14. Method of claim 1, wherein the oxide powder has the general nominal formula $M_{3-m}M'_mCu_3O_{9-\delta}$, where m is about 1, $\delta$ is in the range 1.5–2.5, the divergence from the nominal formula amounts of M and M' is at most 10%, M is one or more elements selected from the group consisting of Ba, Ca, and Sr, and M' is one or more elements selected from the group consisting of Y, La, Eu, Lu, and Sc.

15. Method of claim 1, wherein the elongate superconductive body is a wire- or tape-like body, with the cladding material comprising normal metal.

16. Method of claim 1, wherein the cladding material comprises Ag.

17. Method of claim 7, wherein the oxygen donor material is silver oxide, and the silver oxide is part of the quantity of oxide powder.

18. Method of claim 1, wherein the intermediate body is sealed such that the quantity of oxide powder is not in contact with an atmosphere that surrounds the intermediate body, at least some of the oxygen of the oxygen-containing atmosphere being provided by the quantity of oxide powder and/or an oxygen donor material.

19. An article of manufacture comprising an elongate superconductive body, wherein the superconductive body comprises a normal metal cladding material contactingly surrounding substantially sintered oxide powder, with at least a portion of the cladding that is in contact with the oxide powder consisting essentially of normal metal that is substantially inert with respect to oxygen and with respect to the oxide powder under heat treatment conditions used during manufacture of the elongate body.

20. Article of claim 19, wherein the elongate superconductive body is a superconductive magnet or a power or signal transmission line.

21. Article of claim 19, wherein the elongate superconductive body is produced by a method that comprises
   (a) forming an intermediate body comprising a normal metal cladding material surrounding a quantity of oxide powder;
   (b) forming an elongate body from the intermediate body by means of one or more cross-section-reducing operations; and
   (c) heat treating the elongate body such that substantial sintering of the oxide powder occurs, with the oxide powder being in contact with an oxygen-containing atmosphere during at least a part of step (c), with the oxygen concentration in the atmosphere such that the thus produced body manifests superconductivity, with $T_c$ of 77 K. or above.

22. Article of claim 19, wherein the normal metal that is substantially inert with respect to oxygen and the oxide powder is Ag.

23. Article of claim 19, wherein the normal metal that is substantially inert with respect to oxygen and oxide powder forms a diffusion barrier adapted for preventing migration of oxygen from the oxide into or through the diffusion barrier.

* * * * *